(12) United States Patent
Torng et al.

(10) Patent No.: US 10,592,804 B2  
(45) Date of Patent: *Mar. 17, 2020

(54) MEMORY SUBSYSTEM IN CNN BASED DIGITAL IC FOR ARTIFICIAL INTELLIGENCE

(71) Applicant: GYRFALCON TECHNOLOGY INC., Milpitas, CA (US)

(72) Inventors: Chyu-Jiuh Torng, Dublin, CA (US); Lin Yang, Milpitas, CA (US); Qi Dong, San Jose, CA (US)

(73) Assignee: Gyrfalcon Technology Inc., Milpitas, CA (US)

( * ) Notice: Subject to any disclaimer, the term of this patent is extended or adjusted under 35 U.S.C. 154(b) by 9 days.

This patent is subject to a terminal disclaimer.

(21) Appl. No.: 16/403,679

(22) Filed: May 6, 2019

(65) Prior Publication Data

US 2019/0258923 A1 Aug. 22, 2019

Related U.S. Application Data

(63) Continuation of application No. 15/632,203, filed on Jun. 23, 2017, now Pat. No. 10,331,999, which is a (Continued)

(51) Int. Cl.
*G06N 3/063* (2006.01)
*G06F 3/06* (2006.01)
(Continued)

(52) U.S. Cl.
CPC .............. *G06N 3/063* (2013.01); *G06F 3/065* (2013.01); *G06F 3/0619* (2013.01);
(Continued)

(58) Field of Classification Search
CPC .............. G06F 3/0629; G06F 13/4068; G06F 13/1668; G06F 3/0679; G06F 3/061;
(Continued)

(56) References Cited

U.S. PATENT DOCUMENTS 5,355,528 A * 10/1994 Roska .................. G06N 3/0635  
706/38  
7,884,433 B2 2/2011 Zhong et al.  
(Continued)

OTHER PUBLICATIONS

USPTO restriction requirement for U.S. Appl. No. 15/477,263 (parent case) dated Aug. 2, 2018.
(Continued)

*Primary Examiner* — Khamdan N. Alrobaie

(57) ABSTRACT

CNN based digital IC for AI contains a number of CNN processing units. Each CNN processing unit contains CNN logic circuits operatively coupling to a memory subsystem having first and second memories. The first memory includes an array of magnetic random access memory (RAM) cells for storing weights (e.g., filter coefficients) and the second memory contains SRAM for storing input signals (e.g., imagery data). The first memory may store one-time-programming weights. The memory subsystem may contain a third memory that contains magnetic RAM cells for storing one-time-programming data for security purpose. The magnetic RAM includes STT-RAM or OST-MRAM in SLC or MLC technology.

12 Claims, 10 Drawing Sheets

Related U.S. Application Data continuation-in-part of application No. 15/477,263, filed on Apr. 3, 2017, now Pat. No. 10,331,367.

(51) Int. Cl.

| | |
|---|---|
| *G11C 11/54* | (2006.01) |
| *G11C 11/00* | (2006.01) |
| *G06N 3/04* | (2006.01) |
| *G11C 17/16* | (2006.01) |
| *G11C 11/412* | (2006.01) |
| *G11C 11/56* | (2006.01) |
| *G11C 11/16* | (2006.01) |

(52) U.S. Cl.
CPC ......... *G06F 3/0685* (2013.01); *G06N 3/0454* (2013.01); *G11C 11/005* (2013.01); *G11C 11/54* (2013.01); *G11C 11/161* (2013.01); *G11C 11/412* (2013.01); *G11C 11/5607* (2013.01); *G11C 17/16* (2013.01)

(58) Field of Classification Search
CPC .............. G11C 11/161; G11C 11/1675; G11C 11/5607; G11C 11/1673; H01L 27/222; H01L 43/08; H01L 43/12; H01L 43/02; G06N 3/04
See application file for complete search history.

(56) References Cited

U.S. PATENT DOCUMENTS

| | | | |
|---|---|---|---|
| 8,183,061 | B2 | 5/2012 | Zhong et al. |
| 8,324,698 | B2 | 12/2012 | Zhong et al. |
| 8,772,051 | B1 | 7/2014 | Zhong et al. |
| 8,803,293 | B2 | 8/2014 | Zhong et al. |
| 8,933,542 | B2 | 1/2015 | Zhong et al. |
| 9,111,222 | B2* | 8/2015 | Aparin ................ G06N 3/0472 |
| 9,166,143 | B1 | 10/2015 | Gan et al. |
| 9,437,272 | B1 | 9/2016 | Lu et al. |
| 9,673,388 | B2 | 6/2017 | Toh et al. |
| 9,685,604 | B2 | 6/2017 | Huang et al. |
| 9,734,880 | B1* | 8/2017 | Augustine ............. G06N 3/049 |
| 9,767,557 | B1 | 9/2017 | Gulsun et al. |
| 9,940,534 | B1 | 4/2018 | Yang et al. |
| 9,959,500 | B1* | 5/2018 | Torng ....................... G06N 3/08 |
| 2006/0011958 | A1 | 1/2006 | Jeong et al. |
| 2007/0047294 | A1 | 3/2007 | Panchula |
| 2008/0235432 | A1* | 9/2008 | Chen ................... G06F 12/0246 711/100 |
| 2011/0273926 | A1 | 11/2011 | Wu et al. |
| 2012/0294076 | A1 | 11/2012 | Lee et al. |
| 2012/0294078 | A1 | 11/2012 | Kent et al. |
| 2014/0071741 | A1 | 3/2014 | Kim et al. |
| 2016/0218280 | A1 | 7/2016 | Park et al. |
| 2016/0225818 | A1 | 8/2016 | Toh et al. |
| 2016/0322090 | A1 | 11/2016 | Chan et al. |
| 2017/0039472 | A1 | 2/2017 | Kudo |
| 2017/0040531 | A1 | 2/2017 | Chung et al. |
| 2017/0083813 | A1* | 3/2017 | Augustine ............. G06N 3/049 |
| 2017/0092693 | A1 | 3/2017 | Tan et al. |
| 2017/0092851 | A1 | 3/2017 | Han et al. |
| 2017/0103298 | A1 | 4/2017 | Liang et al. |
| 2017/0103299 | A1 | 4/2017 | Aydonat et al. |
| 2017/0110653 | A1 | 4/2017 | Seo et al. |
| 2017/0125666 | A1 | 5/2017 | Han et al. |
| 2017/0148979 | A1 | 5/2017 | Kim et al. |
| 2017/0324025 | A1 | 11/2017 | Lee et al. |
| 2018/0137414 | A1 | 5/2018 | Du et al. |

OTHER PUBLICATIONS

USPTO office action for U.S. Appl. No. 15/477,263 (parent case) dated Sep. 7, 2018.
USPTO office action for U.S. Appl. No. 15/591,069 (related case) dated Sep. 7, 2018.
USPTO office action for U.S. Appl. No. 15/632,203 (parent case) dated Sep. 20, 2018.
USPTO office action for U.S. Appl. No. 15/632,203 (parent case) dated Feb. 26, 2019.
USPTO notice of allowance for U.S. Appl. No. 15/477,263 (parent case) dated Mar. 11, 2019.
USPTO notice of allowance for U.S. Appl. No. 15/591,069 (related case) dated Mar. 14, 2019.
USPTO notice of allowance for U.S. Appl. No. 15/632,203 (parent case) dated Mar. 25, 2019.
Zhao et al. "Design of MRAM based Logic Circuits and its Applications", Proceeding GLSVLSI '11 Proceedings of the 21st edition of the great lakes symposium on Great lakes symposium on VLSI pp. 431-436 Lausanne, Switzerland—May 2-4, 2011.
Kodzuka et al. "Effects of boron composition on tunneling magnetoresistance ratio and microstructure of CoFeB/MgO/CoFeB pseudo-spin-valve magnetic tunnel junctions", Journal of Applied Physics 111, 043913 (2012).
Sze et al. "Hardware for Machine Learning: Challenges and Opportunities", Published at an invited conference paper at CICC 2017, Submitted on Dec. 22, 2016 (v1).
L. Thomas et al. "Basic Principles, Challenges and Opportunities of STT-MRAM for Embedded Memory Applications" MSST 2017—Santa Clara, May 17, 2017.
Kultursay et al. "Evaluating STT-RAM as an Energy-Efficient Main Memory Alternative", Published in: Performance Analysis of Systems and Software (ISPASS), 2013 IEEE International Symposium, Apr. 21-23, 2013.
Thomas, et al. Perpendicular spin transfer torque magnetic random access memories with high spin torque efficiency and thermal stability for embedded applications:, J. App. Physics 2014:115(17) 172615.

\* cited by examiner

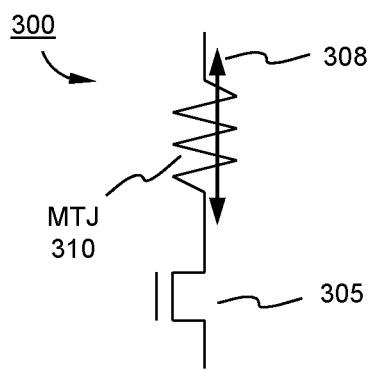
FIG. 3A
FIG. 3B
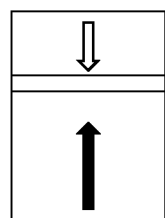
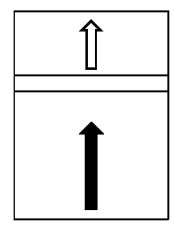
FIG. 3C
FIG. 3D

500

| Soft Domain Reference (SAF) Layer 515 |
| Soft Domain Oxide Barrier Layer 514 |
| Soft Domain Free Layer 513 |
| Soft Domain Nonmagnetic Metal Layer 512 |
| Soft Domain Perpendicularly Magnetized Polarizer Layer 511 |
| High Selectivity Layer 510 |
| Hard Domain Reference (SAF) Layer 505 |
| Hard Domain Oxide Barrier Layer 504 |
| Hard Domain Free Layer 503 |
| Hard Domain Nonmagnetic Metal Layer 502 |
| Hard Domain Perpendicularly Magnetized Polarizer Layer 501 |

*FIG. 5A*

MEMORY SUBSYSTEM IN CNN BASED DIGITAL IC FOR ARTIFICIAL INTELLIGENCE

CROSS-REFERENCE TO RELATED APPLICATIONS

This application is a continuation of a co-pending U.S. patent application Ser. No. 15/632,203 filed on Jun. 23, 2017, which is a continuation-in-part (CIP) of a co-pending U.S. patent application Ser. No. 15/477,263, entitled "Embedded Memory Subsystems For A CNN Based Processing Unit And Methods Of Making" filed on Apr. 3, 2017. All of which are hereby incorporated by reference in their entirety for all purposes.

FIELD

The invention generally relates to the field of integrated circuit and more particularly to memory subsystem in CNN based digital Integrated Circuit (IC) for Artificial Intelligence (AI).

BACKGROUND

Artificial Intelligence (AI) is defined as intelligence exhibited by machines (e.g., computers, processors, etc.). Intelligence means the ability to acquire and apply knowledge and skills. Many different approaches have been tried and tested in AI research since 1960s. One of the more promising techniques is based on Cellular Neural Networks or Cellular Nonlinear Networks (CNN). CNN have been applied to many different fields and problems including, but limited to, image processing, speech recognition, etc. However, most of the prior art CNN approaches are either based on software solutions (e.g., Convolutional Neural Networks, Recurrent Neural Networks, etc.) or based on hardware that are designed for other purposes (e.g., graphic processing, general computation, etc.). As a result, CNN prior approaches are too slow in term of computational speed and/or too expensive thereby impractical for processing large amount of imagery data. The imagery data can be from any two-dimensional signals (e.g., a still photo, a picture, a frame of a video stream, etc.).

For a CNN based IC for artificial intelligence, data must be provided as close to the CNN processing logic. In addition, different characteristics of data may be required. For example, in image processing, filter coefficients and imagery data have different requirements. Filter coefficients need to be validly stored for long time, while the imagery data are written and read more often.

SUMMARY

This section is for the purpose of summarizing some aspects of the invention and to briefly introduce some preferred embodiments. Simplifications or omissions in this section as well as in the abstract and the title herein may be made to avoid obscuring the purpose of the section. Such simplifications or omissions are not intended to limit the scope of the invention.

For a CNN processing unit for either mobile co-processor or servo co-processor for processing large amount of input signals (e.g., imagery data, voice data, etc.) Processing-in memory or memory-in processor is the most promising approach. Together with low power consumption, read/write speed and highly distributed on the same silicon are the three major requirements.

According to a first embodiment, a CNN based digital IC for AI contains a number of CNN processing units. Each CNN processing unit comprises CNN logic circuits operatively coupling to a memory subsystem that includes first and second memories. The first memory includes an array of magnetic random access memory cells for storing weights (e.g., filter coefficients) while the second memory contains an array of static random access memory (SRAM) cells for storing input signals (e.g., imagery data). The first memory is made of either spin transfer torque magnetic rand access memory (STT-RAM) or orthogonal spin transfer magnetic random access memory (OST-MRAM ) based on SLC or MLC technology.

According to a second embodiment, a CNN based digital IC for AI contains a number of CNN processing units. Each CNN processing unit comprises CNN logic circuits operatively coupling to a memory subsystem that includes first and second memories. The first memory includes an array of magnetic random access memory cells for storing one-time-programming (OTP) weights (e.g., filter coefficients). The second memory includes an array of static random access memory (SRAM) cells for storing input signals (e.g., imagery data). The first memory is made of either STT-RAM or OST-MRAM based on SLC or MLC technology. OTP memory can be created during various stages of fabrication or use of the IC.

According to a third embodiment, a CNN based digital IC for AI contains a number of CNN processing units. Each CNN processing unit comprises CNN logic circuits operatively coupling to a memory subsystem that includes an array of first magnetic random access memory cells for storing weights, an array of second static random access memory (SRAM) cells for storing input signals and an array of third magnetic random access memory cells for storing OTP unique data pattern for security purpose. All three memories made of either MLC STT-RAM or MLC OST-MRAM can be fabricated on a same silicon. OTP memory can be created during various stages of fabrication or use of an IC.

To break down the oxide barrier layers for creating OTP memory, a number of techniques are used: To break down the oxide barrier layer of a MTJ element in SLC technology or respective oxide barrier layers of MTJ elements in MLC technology for creating OTP memory, a number of techniques are used:
(a) applying an electric voltage higher than normal read/write voltage (a range of 100-700 mV(millivolts) in SLC technology and 0.1-1.5 V (volts) in MLC technology) during fabrication or use;
(b) applying an electric current longer than normal read/write time or duty cycle of 5 ns (nanoseconds) during fabrication or use;
(c) setting different size of MTJ elements (bits) in a range of 20-150 nm during fabrication, the smaller size of MTJ element is easier for respective oxide barrier layers to be broken down; and
(d) setting different cell size such that different gate length of transistors can be used during fabrication, a larger transistor would provide larger electric current. The preferred gate length of a transistor is between 50 nm to 280 nm for 28 nm semiconductor technology.

Furthermore, the aforementioned techniques are used alone or in any combinations, for example, (a) and (c), (a) and (d), (c) and (d), (b), (c) and (d), and the likes.

Other objects, features, and advantages of the invention will become apparent upon examining the following detailed description of an embodiment thereof, taken in conjunction with the attached drawings.

BRIEF DESCRIPTION OF THE DRAWINGS

These and other features, aspects, and advantages of the invention will be better understood with regard to the following description, appended claims, and accompanying drawings as follows:

FIGS. 3A-3D are diagrams showing various features of an example single-level cell (SLC) STT-RAM being used for forming a memory subsystem, according to an embodiment of the invention;

FIGS. 5A-5E are diagrams showing various features of an example MLC OST-RAM being used for forming a memory subsystem, according to an embodiment of the invention;

DETAILED DESCRIPTIONS

In the following description, numerous specific details are set forth in order to provide a thorough understanding of the invention. However, it will become obvious to those skilled in the art that the invention may be practiced without these specific details. The descriptions and representations herein are the common means used by those experienced or skilled in the art to most effectively convey the substance of their work to others skilled in the art. In other instances, well-known methods, procedures, and components have not been described in detail to avoid unnecessarily obscuring aspects of the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams or circuits representing one or more embodiments of the invention do not inherently indicate any particular order nor imply any limitations in the invention. Used herein, the terms "top", "bottom", "upper", "lower", "vertical", "horizontal", "planar", "parallel", "anti-parallel", "perpendicular", "plan", "elevation" are intended to provide relative positions for the purposes of description, and are not intended to designate an absolute frame of reference. Additionally, term "MTJ element" and "MTJ bit" are interchangeable.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Embodiments of the invention are discussed herein with reference to FIGS. 1-6B. However, those skilled in the art will readily appreciate that the detailed description given herein with respect to these figures is for explanatory purposes as the invention extends beyond these limited embodiments.

Figure 1:
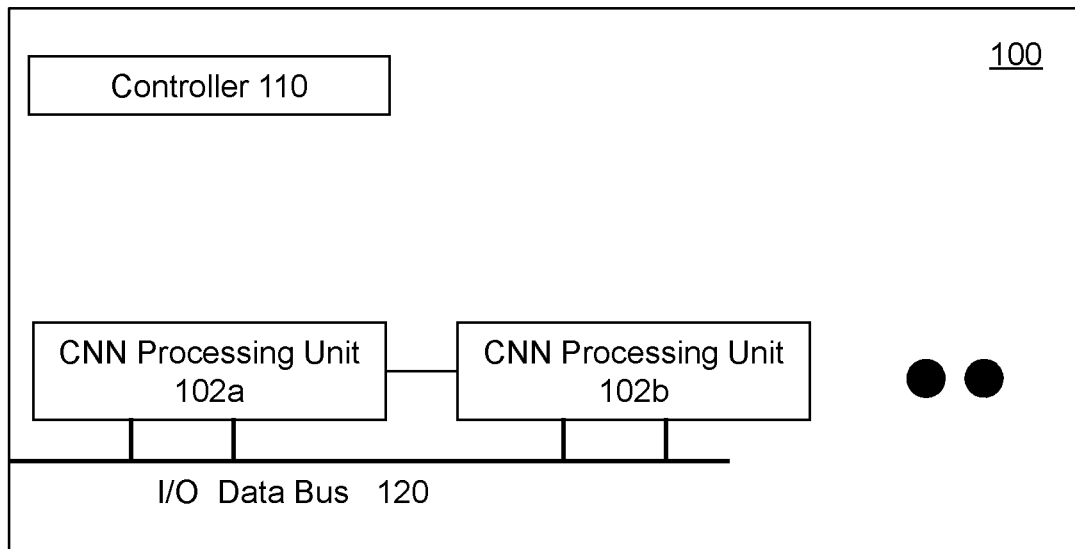
FIG. 1 is a block diagram illustrating an example CNN based IC for artificial intelligence in accordance with one embodiment of the invention.

Referring first to FIG. 1, it is shown a block diagram illustrating an example CNN based digital integrated circuit (IC) for artificial intelligence 100 for artificial intelligence (e.g., image processing, voice reorganization, etc.) in accordance with one embodiment of the invention.

The IC 100 is implemented as a digital semi-conductor chip (e.g., a silicon substrate) and contains a controller 110, and a plurality of CNN processing units 102a-102b operatively coupled to at least one input/output (I/O) data bus 120. Controller 110 is configured to control various operations of the CNN processing units 102a-102b, which are connected in a loop with a clock-skew circuit (e.g., D flip-flop).

In one embodiment, the digital integrated circuit 100 is extendable and scalable. For example, multiple copy of the digital integrated circuit 100 can be implemented on a single semi-conductor chip.

Figure 2A:
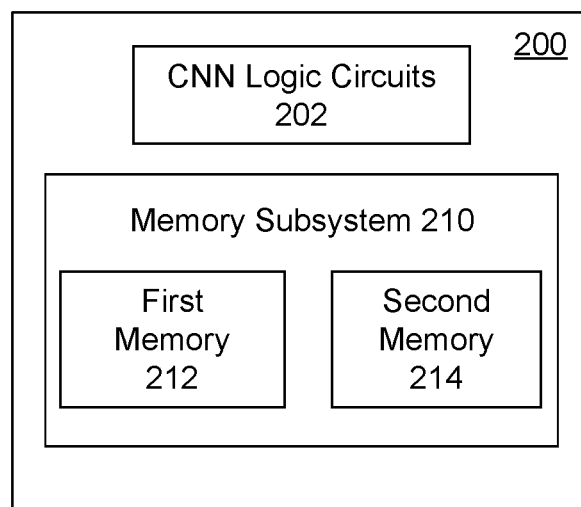
FIG. 2A is a function block diagram showing an example CNN processing unit including a first example memory subsystem according to an embodiment of the invention.

All of the CNN processing units are identical. For illustrating simplicity, function block diagram of an example CNN processing unit 200 is shown in FIG. 2A. The invention sets no limit to the number of CNN processing units on a digital semi-conductor chip.

Each CNN processing unit 200 contains CNN logic circuits 202, which is operatively coupled to an embedded memory subsystem 210. In other words, the memories of the embedded memory subsystem 210 and the CNN logic circuits 202 are located on the same digital semi-conductor chip. In one embodiment, CNN logic circuits 202 are configured for performing convolution operations of input signals with filter coefficients (or weights). In one embodiment, the input signals are imagery data. In another embodiment, the input signals are converted voice data.

Memory subsystem 210 is made of a first memory 212 and a second memory 214. The first memory 212 is configured for requiring data being stored with higher retention rate than the second memory 214. The second memory 214 is configured for higher endurance of balanced data read and write operations than the first memory 212. In one embodiment, the first memory 212 is for storing weights (e.g., filter coefficients) while the second memory 214 is for storing input signals (e.g., imagery data in an image processing application).

The first memory 212 contains a group of magnetic random access memory cells. The second memory 214 contains a group of static random access memory (SRAM) cells. Magnetic random access memory comprises either spin transfer torque magnetic random access memory (STT-RAM) or orthogonal spin transfer magnetic memory (OST-MRAM). Each of the magnetic random access memory cells contains one magnetic tunnel junction (MTJ) element in single-level cell (SLC) technology and contains at least two MTJ elements (e.g., upper and lower MTJ elements) in multi-level cell (MLC) technology.

According to one embodiment in SLC technology based STT-RAM, each MTJ element has a circular planar area, which has a diameter in a range of 20-120 nm (nanometer). The details are shown in FIGS. 3A-3D and FIG. 6A.

According to another embodiment in MLC technology based STT-RAM, lower and upper MTJ elements have different sizes in terms of planar area at different planes. The details are shown in FIGS. 4A-4F.

The details of an MTJ element in SLC OST-MRAM are shown in FIGS. 3E-3G and FIGS. 5A-5E show details of MTJ elements in MLC OST-MRAM.

Figure 2B:
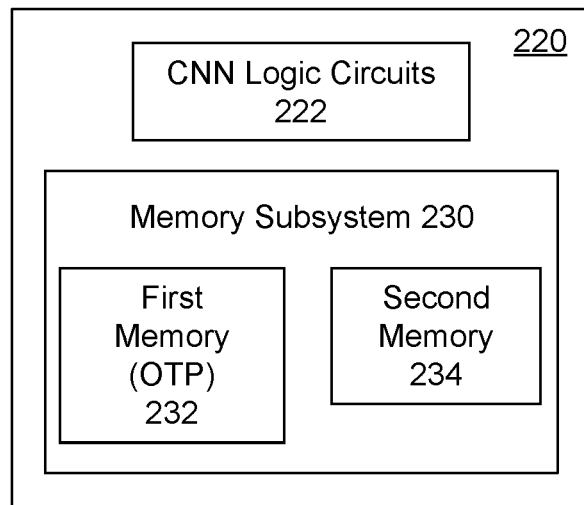
FIG. 2B is a function block diagram showing another example CNN processing unit including a second example memory subsystem according to an embodiment of the invention.

FIG. 2B shows another example CNN processing unit 220, which contains CNN logic circuits 222 operatively coupling to a memory subsystem 230. The memory subsystem 230 includes first memory 232 and second memory 234. The first memory 232 is a one-time-programming (OTP) memory configured for storing filter coefficients or weights that are stored once and never changed. In other words, one specific set of filters are stored in the memory subsystem of respective CNN processing units of a CNN based digital IC for AI, which is designed for performing one specific task (e.g., extracting a particular feature of an image such as traffic signal recognition, lane keeping, etc.). The second memory 234 is configured for storing imagery data, which requires frequent read/write operations. The first memory 232 is made of either STT-RAM or OST-MRAM cells based on SLC or MLC technology. The second memory 234 is mode of SRAM cells.

Figure 2C:
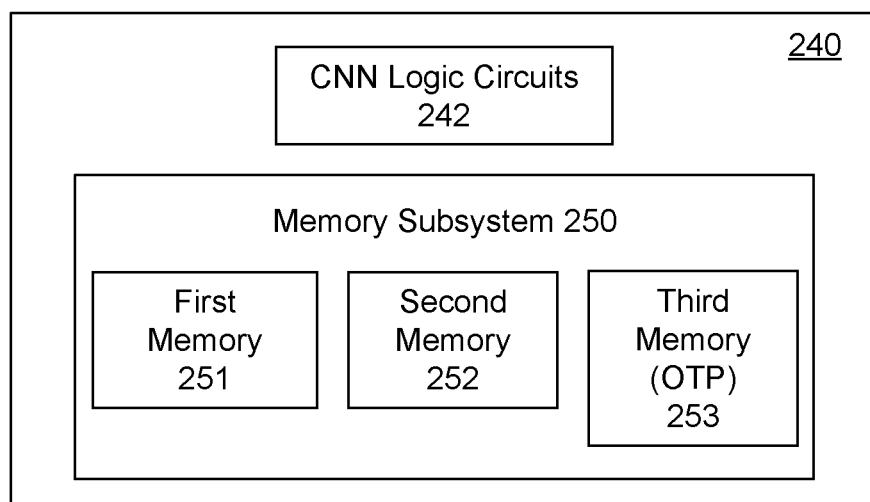
FIG. 2C is a function block diagram showing yet another example CNN processing unit including a third example memory subsystem according to an embodiment of the invention.

In another embodiment shown in FIG. 2C, a CNN processing unit 240 comprises CNN logic circuits 242 operatively coupling to a memory subsystem 250. The memory subsystem 250 contains first memory 251, second memory 252 and third memory 253. The first memory 251 is configured for storing filter coefficients and the second memory 252 is configured for storing imagery data substantially similar to the CNN processing unit 200 of FIG. 2A. The third memory 253 is a one-time-programming (OTP) memory that can be used for other purposes (e.g., a unique pattern for security). The first memory 251 and the third memory 253 are made of either STT-RAM or OST-RAM cells based on SLC or MLC technology. The second memory is made of SRAM cells.

For OTP memory (i.e., first memory 232 in FIG. 2B or third memory 253 in FIG. 2C), the diameter of planar circular area of an MTJ element has a range of 20-150 nm for either SLC or MLC technology.

FIG. 3A is a schematic diagram showing components of an example SLC STT-RAM cell 300. Each SLC STT-RAM cell 300 contains one transistor 305 and one MTJ (Magnetic Tunnel Junction) element 310 located between source line, bit line and word line. A spin-polarized electric current 308 (shown as an arrow) is used for controlling (i.e., reading and writing) the state of MTJ element 310. In one embodiment, MTJ element operates in a Current Perpendicular to Plane configuration. This also referred to as perpendicular MTJ (PMTJ) element.

FIG. 3B shows a first example MTJ element 310 that contains two ferromagnetic layers 311 and 313 located on either side of an oxide barrier layer 312. The first ferromagnetic layer's magnetization direction is switchable by the spin-polarized electric current, while the second ferromagnetic layer's magnetization direction is fixed and can provide the spin-polarized electric current for switching. Therefore, the first ferromagnetic layer is referred to as a free layer 311 and the second ferromagnetic layer is referred to as a pinned or fixed magnetic layer 313. The relative direction of magnetization of free layer 311 and pinned layer 313 gives two different states (i.e., zero and one) of the first example MTJ element 310.

In an alternative embodiment, the three layers of a second example MTJ element 320 is reversely arranged from the first example MTJ element 310. In the second example MTJ element 320, the top layer is pinned layer 323 and the bottom layer is free layer 321. The oxide barrier layer 322 is located in between.

FIG. 3C shows an MTJ element in an SLC STT-RAM having different magnetization directions (i.e., arrows having different directions) in free layer 311 and in pinned layer 313, while FIG. 3D shows two layers having the same magnetization directions. In one embodiment, state "1" and state "0" are assigned to respective configurations in FIG. 3C and FIG. 3D. SLC STT-RAM cell uses a spin-polarized electric current 308 to write only to MTJ element that needs state changes. MTJ element magnetization switching occurs due to a transfer of angular momentum between the spins within the local magnetic moment and electrons passing through the MTJ element 310.

Figure 4A:
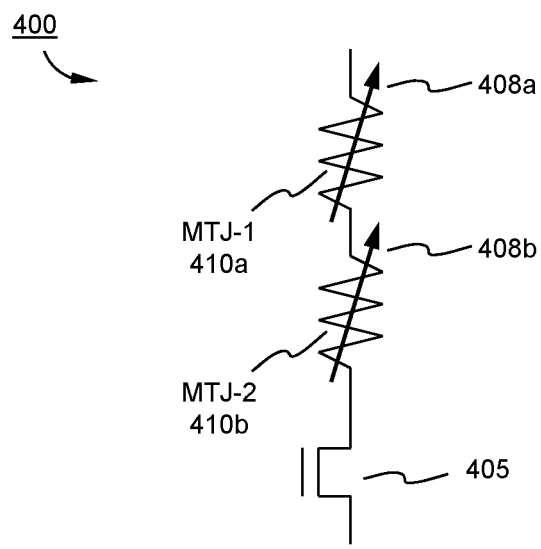
FIGS. 4A-4F are diagrams showing various features of an example MLC STT-RAM being used for forming a memory subsystem, according to an embodiment of the invention.
Figure 4B:
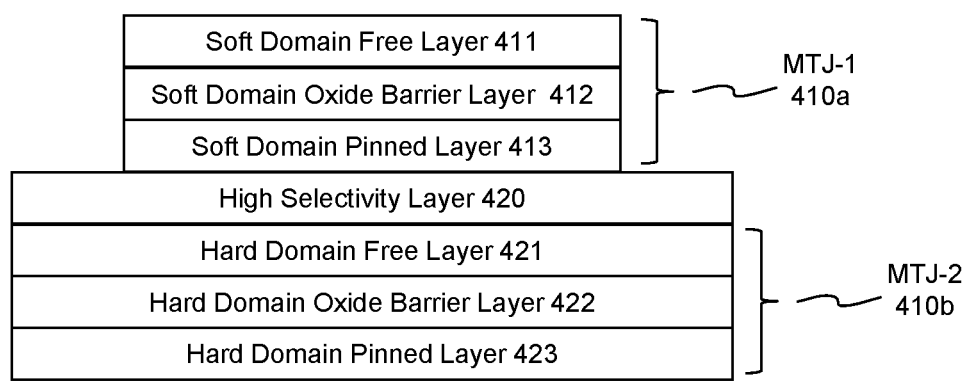
Figure 4C:
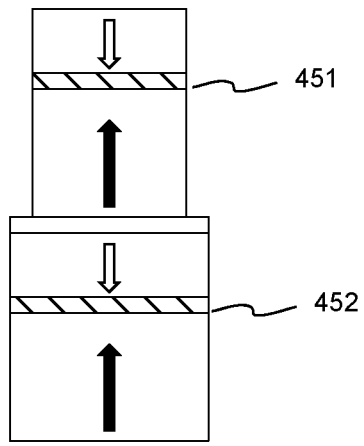
Figure 4D:
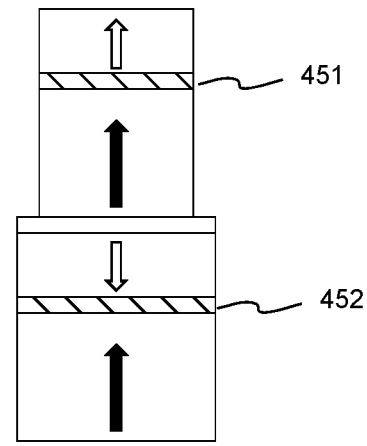
Figure 4E:
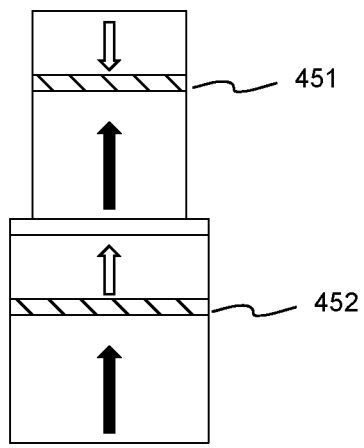
Figure 4F:
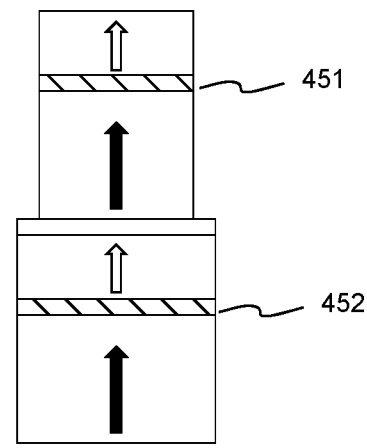

Referring now to MLC technology, FIG. 4A is a schematic diagram showing components of an example MLC STT-RAM cell 400. Each MLC STT-RAM cell 400 contains one transistor 405 and a vertically orientated stack of two MTJ elements (i.e., MTJ-1 410a and MTJ-2 410b) located between source line, bit line and word line (not shown). Respective spin-polarized electric currents 408a-408b (shown as an arrow) are used for controlling (i.e., reading and writing) the state of MTJ-1 410a and MTJ-2 410b. FIG. 4B depicts the structure of an example stack of upper and lower MTJ elements. The vertically orientated stack contains MTJ-1 410a and MTJ-2 410b separated by a high selectivity layer (HSL) 420. Upper MTJ element (MTJ-1 410a) contains a soft domain free layer 411, a soft domain oxide barrier layer 412 and a soft domain pinned layer 413, while lower MTJ element (MTJ-2 410b) contains a hard domain free layer 421, a hard domain oxide barrier layer 422 and a hard domain pinned layer 423. The example upper and lower MTJ elements of MLC STT-RAM allow four distinct states "11", "10", "01" and "00" shown in FIGS. 4C-4F, respectively. Two bits are represented by hard domain and soft domain, respectively. Soft domain MTJ element (i.e., upper MTJ element MTJ-1 410a) has a smaller size comparing to hard domain MTJ element (i.e., lower MTJ element MTJ-2 410b).

Whereas the example shown in FIGS. 4A-4F is for a vertically orientated stack of two MTJ elements, more than two MTJ elements may be in a stack to provide additional states (e.g., three MTJ elements for 8 states).

Figure 3E:
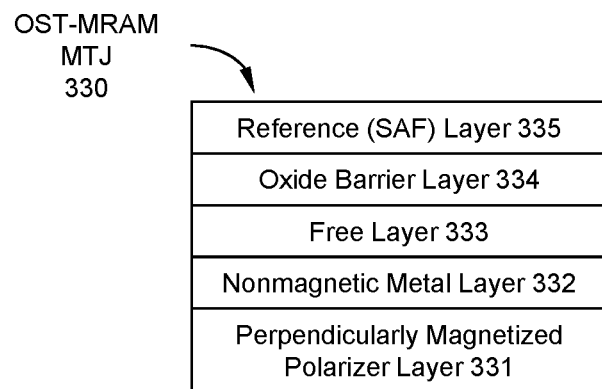
FIGS. 3E-3G are diagrams showing various features of an example SLC Orthogonal Spin Transfer Magnetic RAM (OST-MRAM) being used for forming a memory subsystem, according to an embodiment of the invention.
Figure 3F:
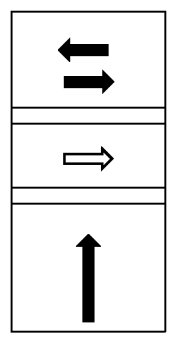
Figure 3G:
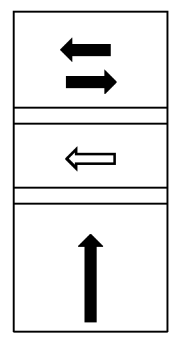

FIG. 3E is a diagram showing an example MTJ element 330 of an SLC OST-MRAM. The SLC OST-MRAM MTJ element 330 contains five layers: perpendicularly magnetized polarizer layer 331, nonmagnetic metal layer 332 (e.g., copper coupling layer), free layer 333, oxide barrier layer 334 and reference layer 335 (e.g., SAF (synthetic antiferromagnetic) layer). Two different states (i.e., anti-parallel shown in FIG. 3F and parallel shown in FIG. 3G) represent "1" and "0". Magnetization direction in polarizer layer 331 is perpendicular to the horizontal plane of the MTJ element 330, while respective magnetization directions in free layer 333 and in reference layer 335 are parallel to the horizontal plane. Instead of having a circular shape for the STT-RAM MTJ element 310, the OST-MRAM MTJ element 330 has a different shape (e.g., elliptical shape 471 shown in FIG. 4C).

Figure 5B:
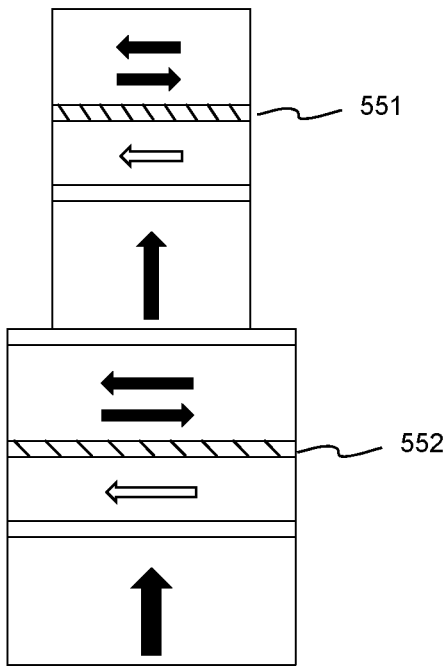
Figure 5C:
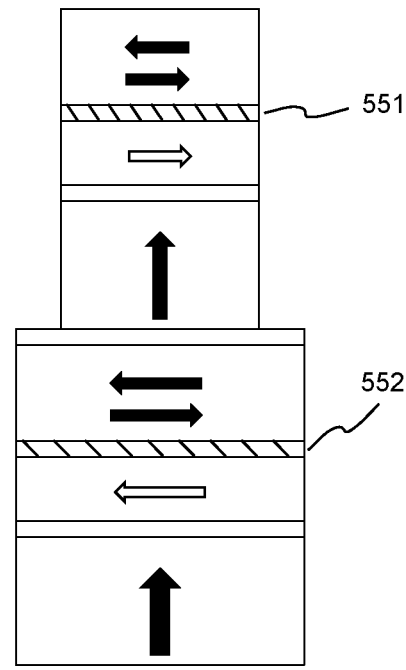
Figure 5D:
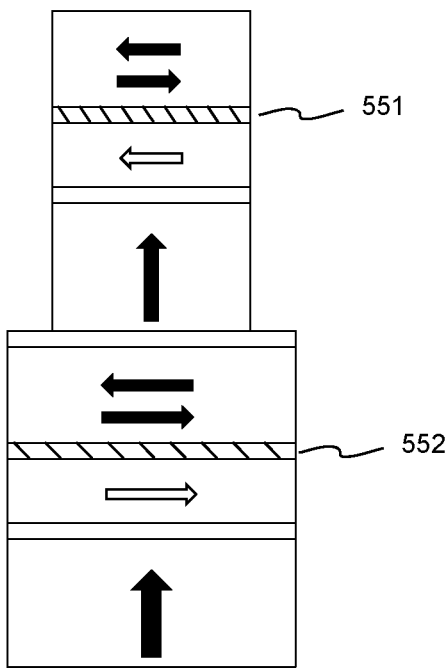
Figure 5E:
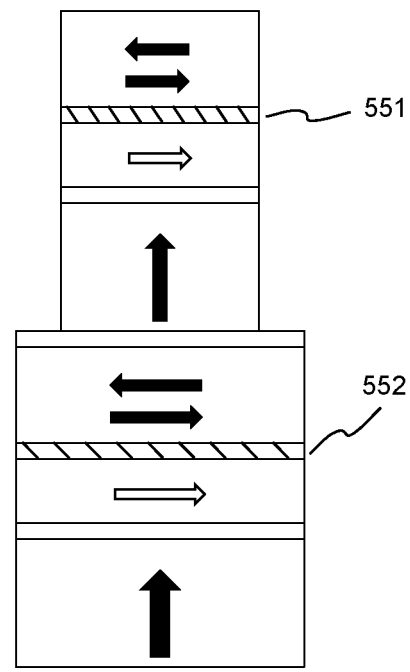

The structure 500 of an example stack of upper and lower MTJ elements of an MLC OST-MRAM is illustrated in FIG. 5A. Upper and lower MTJ elements are separated by high selectivity layer 510. The upper MTJ element contains a soft domain reference (SAF) layer 515, a soft domain oxide barrier layer 514, a soft domain free layer 513, a soft domain nonmagnetic metal layer 512 and a soft domain perpendicularly magnetized polarizer layer 511. The lower MTJ element contains a hard domain reference (SAF) layer 505, a hard domain oxide barrier layer 504, a hard domain free layer 503, a hard domain nonmagnetic metal layer 502 and a hard domain perpendicularly magnetized polarizer layer 501. FIGS. 5B-5E illustrates four distinct states "11", "10", "01" and "00" of the upper and lower MTJ elements of an example MLC OST-MRAM.

Other types of memory technology having substantially similar characteristics of STT-RAM or OST-MRAM cell may be used for forming memory cells in a memory subsystem for a CNN based digital IC for artificial intelligence.

Figure 3H:
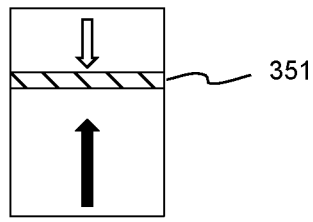
FIGS. 3H-3K are diagrams showing various example MTJ elements with a broken-down oxide barrier layer in SLC technology, according to an embodiment of the invention.
Figure 3I:
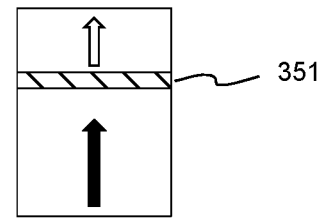
Figure 3J:
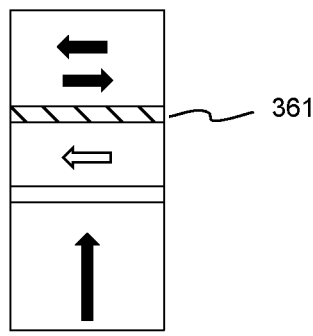
Figure 3K:
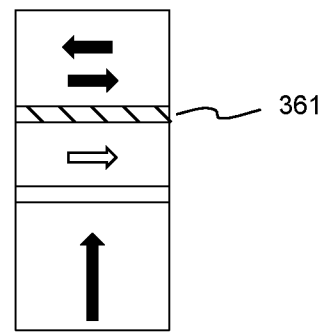

In order to create OTP memory, one method is to break down the oxide barrier layer of MTJ element in either STT-RAM or OST-MRAM cell in SLC or MLC technology. FIGS. 3H-3I show SLC STT-RAM MTJ element with a broken-down oxide barrier layer 351 for anti-parallel and parallel configurations. FIGS. 3J and 3K show anti-parallel and parallel configurations of respective MTJ elements of an example SLC OST-MRAM having corresponding oxide barrier layer 361 broken down. For MLC STT-RAM, FIGS. 4C-4F show broken-down oxide barrier layers 451-452 for respective MTJ elements. FIGS. 5B-5E show broken-down oxide barrier layers 551-552 for respective MTJ elements for MLC OST-MRAM.

OTP is referred to data being written to memory only one time (e.g., substantially permanent once written). For either STT-RAM cell or OST-MRAM cell in either SLC or MLC technology, OTP can be performed in many stages: wafer level, chip level, after soldering during fabrication of a CNN based digital IC. For example, a specific application such as face recognition requires a particular set of filter coefficients, which can be permanently written to an IC (i.e., first memory 232 in FIG. 2B) during fabrication. Or a specific usage (e.g., security for certain application or user), the data is permanently written to an IC (i.e., third memory 253 in FIG. 2C).

OTP can also be performed after fabrication during use, for example, a specific pattern unique to any application and any user is created and programmed (i.e., written) to the OTP memory in an initialization procedure or at first use. In one embodiment, one user can write a particular set of filter coefficients to an IC (i.e., first memory 232 in FIG. 2B) for one type of applications, while another user can write a different set of filter coefficients for another type of applications. In another embodiment, a unique pattern of data (e.g., user data such as user identification, name, number, fingerprint, etc.) can be written to an IC (i.e., third memory 253 in FIG. 2C) during use for security or other purposes.

To break down the oxide barrier layer of a MTJ element in SLC technology or respective oxide barrier layers of MTJ elements in MLC technology for creating OTP memory, a number of techniques are used:

(a) applying an electric voltage higher than normal read/write voltage (a range of 100-700 mV(millivolts) in SLC technology and 0.1-1.5 V (volts) in MLC technology) during fabrication or use;

(b) applying an electric current longer than normal read/write time or duty cycle of 5 ns (nanoseconds) during fabrication or use;

(c) setting different size of MTJ elements (bits) in a range of 20-150 nm in diameter during fabrication, the smaller size of MTJ element is easier for respective oxide barrier layers to be broken down; and (d) setting different cell size such that different gate length of transistors are used during fabrication, a larger transistor would provide larger electric current. The preferred gate length of a transistor is between 50 nm to 280 nm for 28 nm semiconductor technology.

Furthermore, the aforementioned techniques can be used alone or in any combinations, for example, (a) and (c), (a) and (d), (c) and (d), (b), (c) and (d), and the likes.

Applying larger electric voltage can be achieved by a larger transistor 305 of FIG. 3A or a larger transistor 405 of FIG. 4A. Applying longer electric current 308 through an MTJ element 310 in SLC technology, or applying longer duration of electric current 408a-408b through respective MTJ elements (e.g., MTJ-1 410a and MTJ-2 410b) in MLC technology. An example of different sizes of MTJ elements is shown in FIG. 4A, while different cell size (i.e. different pitch) is shown in FIG. 4B.

Figure 6A:
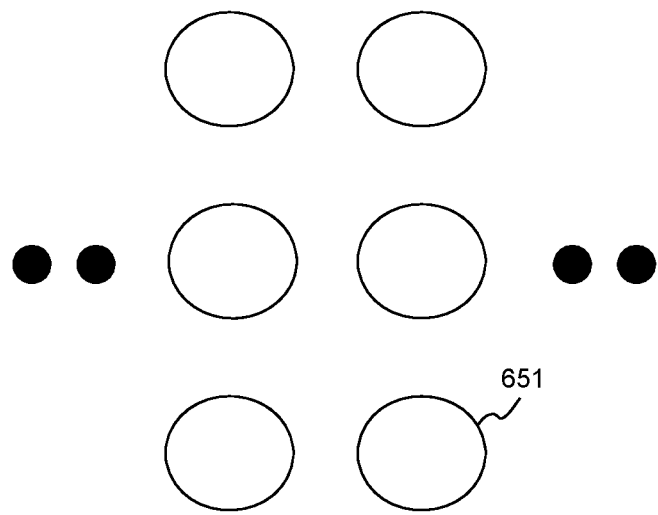
FIG. 6A is a plan view showing respective MTJ elements of an example array of STT-RAM cells in SLC or MLC technology, according to an embodiment of the invention.
Figure 6B:
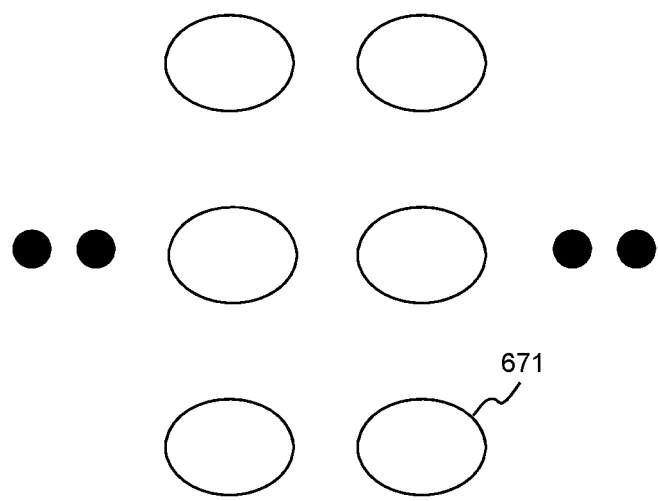
FIG. 6B is a plan view showing respective MTJ elements of an example array of OST-MRAM cells in SLC or MLC technology, according to an embodiment of the invention.

FIG. 6A shows a circular shape 651 of respective MTJ elements of an array of STT-RAM cells. FIG. 6B shows an elliptical shape 671 of respective MTJ elements of an array of OST-MRAM cells. All example MTJ elements shown in FIGS. 6A-6B can be either in SLC or MLC technology.

Although the invention has been described with reference to specific embodiments thereof, these embodiments are merely illustrative, and not restrictive of, the invention. Various modifications or changes to the specifically disclosed exemplary embodiments will be suggested to persons skilled in the art. For example, whereas image processing has been shown and described as an example usage of the CNN based digital IC, other applications may be used, for example, voice recognition. Sound waves can be recorded and converted into a series of digital images (e.g., using fast Fourier Transform), whose features in turn can be extracted using a CNN based digital IC. Furthermore, whereas two MTJ elements have been shown and described for the MLC technology, more than two MTJ elements may be used to achieve the same, for example, three MTJ elements for three-bit of data. Additionally, two groups of different sized MTJ elements have been shown and described for the at least two groups, any number of groups of different sized MTJ elements may be used for achieving the same, for example, three groups. Finally, shape of the HS pads has been generally shown and described as circular, other suitable geometric shapes may be used to achieve the same, for example, elliptical shape. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A digital integrated circuit for artificial intelligence comprising:
    a semi-conductor substrate embedded in a single semi-conductor chip, the semi-conductor substrate containing a plurality of cellular neural networks (CNN) processing units, each CNN processing unit comprising:
    CNN logic circuits; and
    an embedded memory subsystem operatively coupling to the CNN logic circuits;
    the embedded memory subsystem further comprising:
        a first memory containing an array of magnetic random access memory cells configured for storing a set of weights; and
        a second memory containing an array of static random access memory cells configured for storing the input signals that require higher endurance of balanced data read and write operations than the first memory.

2. The digital integrated circuit of claim 1, wherein each of the magnetic random access memory cells comprises a single-level cell spin transfer torque magnetic random access memory (SLC STT-RAM) cell.

3. The digital integrated circuit of claim 1, wherein each of the magnetic random access memory cells comprises a multi-level cell spin transfer torque magnetic random access memory (MLC STT-RAM) cell.

4. The digital integrated circuit of claim 1, wherein said each of the magnetic random access memory cells comprises a single-level cell orthogonal spin transfer magnetic random access memory (SLC OST-MRAM) cell.

5. The digital integrated circuit of claim 1, wherein said each of the magnetic random access memory cells comprises a multi-level cell orthogonal spin transfer magnetic random access memory (MLC OST-MRAM) cell.

6. The digital integrated circuit of claim 1, wherein the semi-conductor substrate comprises a silicon substrate.

7. A digital integrated circuit for artificial intelligence comprising:
    a semi-conductor substrate embedded in a single semi-conductor chip, containing a plurality of cellular neural networks (CNN) processing units, each CNN processing unit comprising:
    CNN logic circuits; and
    an embedded memory subsystem operatively coupling to the CNN logic circuits;
    the embedded memory subsystem further comprising:
        a first memory containing an array of magnetic random access memory cells configured for storing a set of one-time-programming weights; and
        a second memory containing an array of static random access memory cells configured for storing the input signals that require higher endurance of balanced data read and write operations than the first memory.

8. The digital integrated circuit of claim 7, wherein each of the magnetic random access memory cells comprises a single-level cell spin transfer torque magnetic random access memory (SLC STT-RAM) cell.

9. The digital integrated circuit of claim 7, wherein each of the magnetic random access memory cells comprises a multi-level cell spin transfer torque magnetic random access memory (MLC STT-RAM) cell.

10. The digital integrated circuit of claim 7, wherein said each of the magnetic random access memory cells comprises a single-level cell orthogonal spin transfer magnetic random access memory (SLC OST-MRAM) cell.

11. The digital integrated circuit of claim 7, wherein said each of the magnetic random access memory cells comprises a multi-level cell orthogonal spin transfer magnetic random access memory (MLC OST-MRAM) cell.

12. The digital integrated circuit of claim 7, wherein each of the magnetic random access memory cells has at least one MTJ element and each MTJ element contains an oxide barrier layer.

* * * * *